(12) United States Patent
Kushibiki et al.

(10) Patent No.: US 7,811,939 B2
(45) Date of Patent: Oct. 12, 2010

(54) PLASMA ETCHING METHOD

(75) Inventors: Masato Kushibiki, Nirasaki (JP); Chie Kato, Nirasaki (JP); Akitaka Shimizu, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 685 days.

(21) Appl. No.: 11/691,011

(22) Filed: Mar. 26, 2007

(65) Prior Publication Data
US 2007/0224828 A1      Sep. 27, 2007

Related U.S. Application Data

(60) Provisional application No. 60/789,606, filed on Apr. 6, 2006.

(30) Foreign Application Priority Data

Mar. 27, 2006   (JP) ............................. 2006-085375

(51) Int. Cl.
*H01L 21/302* (2006.01)
*H01L 21/461* (2006.01)

(52) U.S. Cl. ...................................... 438/710; 438/719
(58) Field of Classification Search ................ 438/710, 438/719, 714; 216/58, 79
See application file for complete search history.

(56) References Cited

U.S. PATENT DOCUMENTS 4,255,230 A  *  3/1981  Zajac ........................ 438/719
7,138,314 B2 * 11/2006  Song et al. .................. 438/258

FOREIGN PATENT DOCUMENTS

JP          9-232285        9/1997

* cited by examiner

*Primary Examiner*—Roberts Culbert
(74) *Attorney, Agent, or Firm*—Oblon, Spivak, McClelland, Maier & Neustadt, L.L.P.

(57) ABSTRACT

A plasma etching apparatus is arranged to perform main etching for etching a poly-crystalline silicon film by use of $Cl_2/SF_6/N_2$ plasma obtained by exciting $Cl_2$ gas, $SF_6$ gas, and $N_2$ gas, and over etching for etching the poly-crystalline silicon film by use of $Cl_2/HBr/CF_4$ plasma obtained by exciting $Cl_2$ gas, HBr gas, and $CF_4$ gas. In the main etching, $N_2$ gas is added to suppress formation of roughness on a poly-crystalline silicon surface and attain a sufficient etching rate.

14 Claims, 7 Drawing Sheets

PLASMA ETCHING METHOD

CROSS-REFERENCE TO RELATED APPLICATIONS

This application claims the benefit of U.S. Provisional Application No. 60/789,606, filed Apr. 6, 2006.

BACKGROUND OF THE INVENTION

1. Field of the Invention

The present invention relates to a plasma etching method, and specifically to a plasma etching method including a step of etching a target object by use of plasma.

2. Description of the Related Art

In recent years, multi-layered structures are progressively developed for semiconductor devices, such as DRAMs (Dynamic Random Access Memory), to increase the degree of integration. In the process of fabricating a multi-layered structure, formation of contact plugs is repeatedly performed to connect layers on different levels. As a method for forming a contact plug, the following method is known. Specifically, an electrically conductive material, such as poly-crystalline silicon, is deposited on an inter-level insulating film to fill a contact hole by a CVD (Chemical Vapor Deposition) process. The conductive material is then subjected to an etching-back process to leave a part of the conductive material only in the contact hole.

In general, where poly-crystalline silicon, which is a mass of crystal grains, is etched, certain roughness appears on the etched surface. If such roughness is formed on a poly-crystalline silicon surface during an etching-back process, this roughness may be copied and left on an underlying film (for example, an inter-level insulating film) after the etching, and bring about defects in semiconductor devices.

As a technique for forming a smooth poly-crystalline silicon surface by etching-back, there has been proposed a plasma etching method (for example, Jpn. Pat. Appln. KOKAI Publication No. 9-232285) in which an etching gas containing a gas that can emit free sulfur in plasma is used to perform etching-back while forming a sulfur-containing material film on a poly-crystalline silicon surface. According to this proposed method, a gas that can emit free sulfur in plasma is a halogenated sulfur compound having a ratio of halogen atoms/sulfur atoms smaller than 6 (for example, $S_2F_2$, $SF_2$, $SF_4$, $S_2F_{10}$, $S_3Cl_3$, $S_2Cl_2$, or $SCl_2$).

In the etching-back process described above, it is important not only to remove roughness of the poly-crystalline silicon surface, but also to attain a practically sufficient etching rate in light of an improvement in throughput. However, in the case of the method described in Jpn. Pat. Appln. KOKAI Publication No. 9-232285, it seems unlikely that the etching rate can be sufficiently high, because this method is a special method arranged to develop etching while forming a sulfur-containing material layer on a poly-crystalline silicon surface treated as an etching target. Further, the sulfur-containing material layer formed during etching needs to be removed by a heating process or ashing process at the end, thereby entailing an increase in the number of process steps.

BRIEF SUMMARY OF THE INVENTION

An object of the present invention is to provide a plasma etching method for performing plasma etching of poly-crystalline silicon, which can provide a smooth poly-crystalline silicon surface as well as a sufficient etching rate.

According to a first aspect of the present invention, there is provided a plasma etching method comprising: preparing a target object with a poly-crystalline silicon film formed thereon; performing first etching on the poly-crystalline silicon film by use of plasma of an etching gas containing $SF_6$, $Cl_2$, and $N_2$; and performing second etching on the poly-crystalline silicon film by use of plasma of an etching gas containing $Cl_2$, HBr, and $CF_4$ after the first etching.

According to a second aspect of the present invention, there is provided a plasma etching method comprising: preparing a target object with a poly-crystalline silicon film formed thereon; performing first etching on the poly-crystalline silicon film by use of plasma of an etching gas containing $SF_6$, $Cl_2$, and $N_2$; performing second etching on the poly-crystalline silicon film by use of plasma of an etching gas containing $Cl_2$, HBr, and $CF_4$ after the first etching; and performing third etching on the poly-crystalline silicon film by use of plasma of an etching gas containing $Cl_2$, HBr, $CF_4$, and $N_2$ after the second etching.

According to a third aspect of the present invention, there is provided a plasma etching method comprising: preparing a target object having an insulating film with a through-hole formed therein, and a poly-crystalline silicon film covering the insulating film; and performing etching-back of the poly-crystalline silicon film, thereby leaving poly-crystalline silicon selectively within the through-hole, wherein the etching-back of the poly-crystalline silicon film comprises performing first etching on the poly-crystalline silicon film by use of plasma of an etching gas containing $SF_6$, $Cl_2$, and $N_2$.

In the third aspect described above, the etching-back of the poly-crystalline silicon film may comprise performing second etching on the poly-crystalline silicon film by use of plasma of an etching gas containing $Cl_2$, HBr, and $CF_4$ after the first etching. Further, the etching-back of the poly-crystalline silicon film may comprise performing third etching on the poly-crystalline silicon film by use of plasma of an etching gas containing $Cl_2$, HBr, $CF_4$, and $N_2$ after the second etching. The insulating film may be a silicon nitride film.

In these aspects, the first etching may be arranged to set a flow rate of $N_2$ to make up a ratio of 25 to 40% relative to a total flow rate of the etching gas thereof. The poly-crystalline silicon film may be doped with phosphorous.

According to a fourth aspect of the present invention, there is provided a storage medium that stores a program for execution on a computer to control a plasma processing apparatus, the program, when executed by the computer, controlling the plasma processing apparatus to perform a plasma etching method comprising, preparing a target object with a poly-crystalline silicon film formed thereon, performing first etching on the poly-crystalline silicon film by use of plasma of an etching gas containing $SF_6$, $Cl_2$, and $N_2$, and performing second etching on the poly-crystalline silicon film by use of plasma of an etching gas containing $Cl_2$, HBr, and $CF_4$ after the first etching.

According to a fifth aspect of the present invention, there is provided a storage medium that stores a program for execution on a computer to control a plasma processing apparatus, the program, when executed by the computer, controlling the plasma processing apparatus to perform a plasma etching method comprising, preparing a target object with a poly-crystalline silicon film formed thereon, performing first etching on the poly-crystalline silicon film by use of plasma of an etching gas containing $SF_6$, $Cl_2$, and $N_2$, performing second etching on the poly-crystalline silicon film by use of plasma of an etching gas containing $Cl_2$, HBr, and $CF_4$ after the first etching, and performing third etching on the poly-crystalline silicon film by use of plasma of an etching gas containing $Cl_2$, HBr, $CF_4$, and $N_2$ after the second etching.

According to a sixth aspect of the present invention, there is provided a storage medium that stores a program for execution on a computer to control a plasma processing apparatus, the program, when executed by the computer, controlling the plasma processing apparatus to perform a plasma etching method comprising, preparing a target object having an insulating film with a through-hole formed therein, and a poly-crystalline silicon film covering the insulating film, and performing etching-back of the poly-crystalline silicon film, thereby leaving poly-crystalline silicon selectively within the through-hole, wherein the etching-back of the poly-crystalline silicon film comprises performing first etching on the poly-crystalline silicon film by use of plasma of an etching gas containing $SF_6$, $Cl_2$, and $N_2$.

According to a seventh aspect of the present invention, there is provided a plasma process apparatus comprising: a process chamber configured to perform a plasma etching process on a target object; a support member configured to place the target object thereon inside the process chamber; an exhaust system configured to decrease pressure inside the process chamber; a gas supply system configured to supply a process gas into the process chamber; and a control section configured to execute control for processing a target object with a poly-crystalline silicon film formed thereon, inside the process chamber, by performing first etching on the poly-crystalline silicon film by use of plasma of an etching gas containing $SF_6$, $Cl_2$, and $N_2$, and performing second etching on the poly-crystalline silicon film by use of plasma of an etching gas containing $Cl_2$, HBr, and $CF_4$ after the first etching.

According to an eighth aspect of the present invention, there is provided a plasma process apparatus comprising: a process chamber configured to perform a plasma etching process on a target object; a support member configured to place the target object thereon inside the process chamber; an exhaust system configured to decrease pressure inside the process chamber; a gas supply system configured to supply a process gas into the process chamber; and a control section configured to execute control for processing a target object with a poly-crystalline silicon film formed thereon, inside the process chamber, by performing first etching on the poly-crystalline silicon film by use of plasma of an etching gas containing $SF_6$, $Cl_2$, and $N_2$, performing second etching on the poly-crystalline silicon film by use of plasma of an etching gas containing $Cl_2$, HBr, and $CF_4$ after the first etching, and performing third etching on the poly-crystalline silicon film by use of plasma of an etching gas containing $Cl_2$, HBr, $CF_4$, and $N_2$ after the second etching.

According to a ninth aspect of the present invention, there is provided a plasma process apparatus comprising: a process chamber configured to perform a plasma etching process on a target object; a support member configured to place the target object thereon inside the process chamber; an exhaust system configured to decrease pressure inside the process chamber; a gas supply system configured to supply a process gas into the process chamber; and a control section configured to execute control for processing a target object having an insulating film with a through-hole formed therein, and a poly-crystalline silicon film covering the insulating film, inside the process chamber, by performing etching-back of the poly-crystalline silicon film, thereby leaving poly-crystalline silicon selectively within the through-hole, wherein the etching-back of the poly-crystalline silicon film comprises performing first etching on the poly-crystalline silicon film by use of plasma of an etching gas containing $SF_6$, $Cl_2$, and $N_2$.

The plasma etching method according to the present invention is arranged to etch a poly-crystalline silicon film by use of an etching gas containing $Cl_2$ gas and $SF_6$ gas with $N_2$ gas added thereto, thereby preventing formation of roughness on the poly-crystalline silicon surface and making the surface smooth.

Further, where the etching gas described above is used, a practically sufficient etching rate is attained, thereby preventing an increase in the process time period or the number of process steps.

Accordingly, the plasma etching method according to the present invention can be preferably applied to, e.g., an etching-back process for forming a contact plug from poly-crystalline silicon, and thus can be advantageously utilized for manufacturing semiconductor devices with high reliability.

DETAILED DESCRIPTION OF THE INVENTION

Embodiments of the present invention will now be described with reference to the accompanying drawings.

Figure 1:
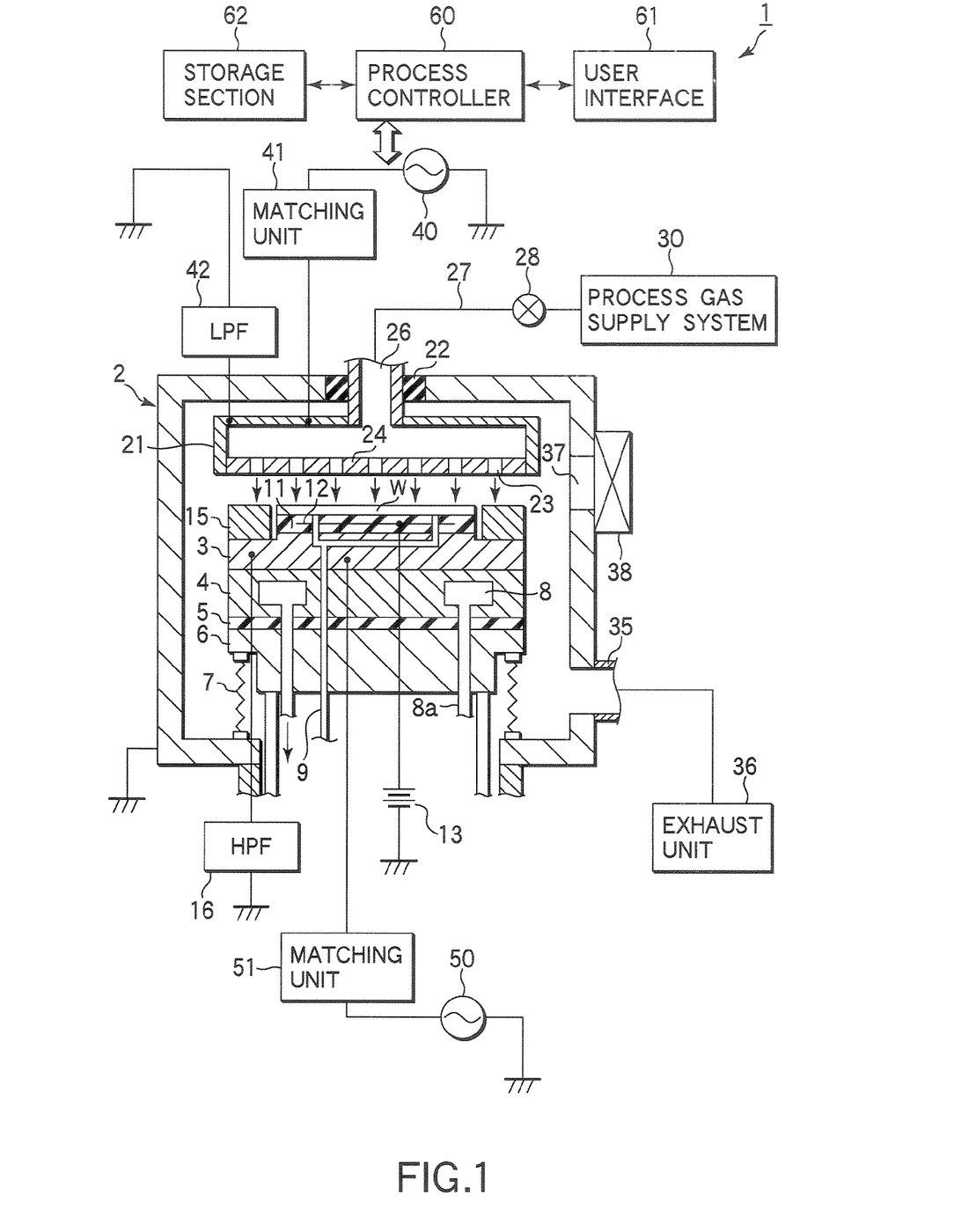
FIG. 1 is a sectional view schematically showing a plasma etching apparatus suitably usable for performing a plasma etching method according to the present invention.

FIG. 1 is a sectional view schematically showing a plasma etching apparatus suitably usable for implementing the present invention.

The plasma etching apparatus 1 includes upper and lower electrode plates facing in parallel with each other, one of which is connected to a power supply for plasma generation, so that a parallel-plate plasma etching apparatus of the capacitive coupling type is structured.

The plasma etching apparatus 1 includes a cylindrical process container or chamber 2 made of, e.g., aluminum with a ceramic spraying-processed surface. The chamber 2 is protectively grounded. A susceptor 3 serving as a lower electrode is disposed in the chamber 2 and supported by a support member 4. A semiconductor wafer (which will be simply referred to as a wafer hereinafter) W made of, e.g., silicon with a predetermined film formed thereon is placed on the susceptor 3 in a horizontal state. The support member 4 is supported on a pedestal 6 provided with an elevating mechanism (not shown) through an insulating plate 5 made of a ceramic. The susceptor 3 can be moved up and down by the elevating mechanism. The bottom central portion of the pedestal 6 on the atmospheric side is covered with a bellows 7 to isolate the interior of the chamber 2 from the atmospheric side.

The support member 4 is provided with a cooling medium space 8 formed therein. A cooling medium, such as Galden™, is supplied and circulated in the cooling medium space 8 through a cooling medium feed line 8a. The cold of the cooling medium is transferred to the wafer W through the susceptor 3, and the target surface of the wafer W is thereby controlled to be a desired temperature. In order to effectively cool the wafer W by the cooling medium circulated in the cooling medium space 8 even when the interior of the chamber 2 is held in a vacuum state, a gas passage 9 is formed to supply a heat transmission medium, such as He gas, to the back side of the target object or wafer W. The cold of the susceptor 3 is effectively transmitted to the wafer W through the heat transmission medium, so that the temperature of the wafer W can be accurately controlled.

The top central portion of the susceptor 3 is projected like a circular plate, which is provided with an electrostatic chuck 11 comprising an electrode 12 and insulating layers sandwiching the electrode 12. The electrode 12 is connected to a direct-current (DC) power supply 13, and supplied with a DC voltage therefrom, so that the wafer W is attracted and held by an electrostatic force, such as a Coulomb force. An annular focus ring 15 is disposed on the top of the periphery of the susceptor 3 to surround the wafer W placed on the electrostatic chuck 11 to improve etching uniformity.

A showerhead 21 serving as an upper electrode is disposed above the susceptor 3 to face the susceptor 3 in parallel therewith. The showerhead 21 is supported at the top of the chamber 2 through an insulating body 22, and has a counter face 24 with a number of delivery holes 23 opposite the susceptor 3. The distance between the surface of the wafer W and the showerhead 21 is set to be within a range of, e.g., 30 to 90 mm, which is adjustable by the elevating mechanism.

Figure 2:
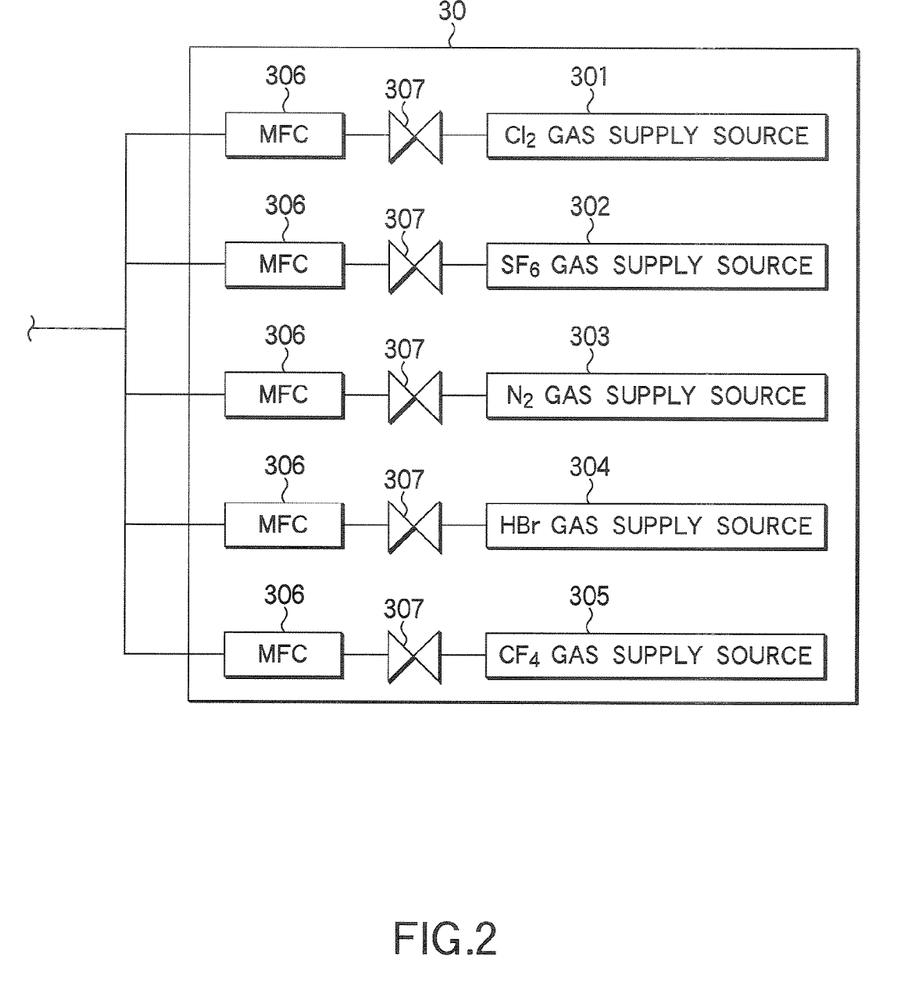
FIG. 2 is a structural diagram showing a process gas supply system used in the plasma etching apparatus shown in FIG. 1.

A gas supply port 26 is formed at the center of the showerhead 21, and connected to a gas supply line 27. The gas supply line 27 is connected through a valve 28 to a process gas supply system 30 for supplying an etching gas. As shown in FIG. 2, the process gas supply system 30 includes a $Cl_2$ gas supply source 301, an $SF_6$ gas supply source 302, an $N_2$ gas supply source 303, an HBr gas supply source 304, and a $CF_4$ gas supply source 305, and each of which is connected to a line provided with a mass-flow controller 306 and a valve 307.

$Cl_2$ gas/$SF_6$ gas/$N_2$ gas or $Cl_2$ gas/HBr gas/$CF_4$ gas is used as an etching gas, and the source gases thereof are supplied from the respective gas supply sources in the process gas supply system 30, through the gas supply line 27 and gas supply port 26 into the space within the showerhead 21, and is then delivered from the gas delivery holes 23.

An exhaust unit 36 is connected to the chamber 2 through an exhaust line 35, which is connected to the sidewall of the chamber 2 near the bottom. The exhaust unit 36 includes a vacuum pump, such as a turbo-molecular pump, which can vacuum-exhaust the interior of the chamber 2 to a predetermined reduced-pressure atmosphere, such as 1 Pa or less. A transfer port 37 for the wafer W is formed in the sidewall of the chamber 2, and is opened/closed by a gate valve 38 disposed on the sidewall. When the gate valve 38 is opened, the wafer W can be transferred through the transfer port 37 between the chamber 2 and an adjacent load lock chamber 6 (not shown).

The showerhead 21 serving as the upper electrode is connected to an RF (radio frequency) power supply 40 through a feed line provided with a matching unit 41. The RF power supply 40 supplies an RF power with a frequency of, e.g., 60 MHz to the upper electrode or showerhead 21, to form an RF electric field for plasma generation between the upper electrode or showerhead 21 and the lower electrode or susceptor 3. Further, a low-pass filter (LPF) 42 is connected to the showerhead 21.

The susceptor 3 serving as the lower electrode is connected to an RF power supply 50 through a feed line provided with a matching unit 51. The RF power supply 50 supplies an RF power with a frequency of, e.g., 13.56 MHz to the lower electrode or susceptor 3, to attract ions in plasma toward the wafer W, thereby realizing etching with high anisotropy. Further, a high-pass filter (HPF) 16 is connected to the susceptor 3.

The respective components of the plasma etching apparatus 1 are connected to and controlled by a process controller 60 comprising a CPU. The process controller 60 is connected to a user interface 61 including, e.g. a keyboard and a display, wherein the keyboard is used for a process operator to input commands for operating the plasma etching apparatus 1, and the display is used for showing visualized images of the operational status of the plasma etching apparatus 1.

Further, the process controller 60 is connected to a storage section 62 that stores recipes containing control programs, process condition data, and so forth recorded therein, for the process controller 60 to control the plasma etching apparatus 1 so as to perform various processes.

A required recipe is retrieved from the storage section 62 and executed by the process controller 60 in accordance with an instruction or the like input through the user interface 61. Consequently, the plasma etching apparatus 1 can perform a predetermined process under the control of the process controller 60. The recipes may be used while they are stored in a computer readable storage medium, such as a CD-ROM, hard disk, flexible disk, or flash memory. Alternatively, the recipes may be used online while they are transmitted from another apparatus through, e.g., a dedicated line, as needed.

Next, an explanation will be given of steps for forming a contact plug by use of an etching-back process of poly-crystalline silicon performed in the plasma etching apparatus 1 having the structure described above.

FIGS. 3 to 6 are views showing sequential steps of a plasma etching method according to this embodiment.

Figure 3:
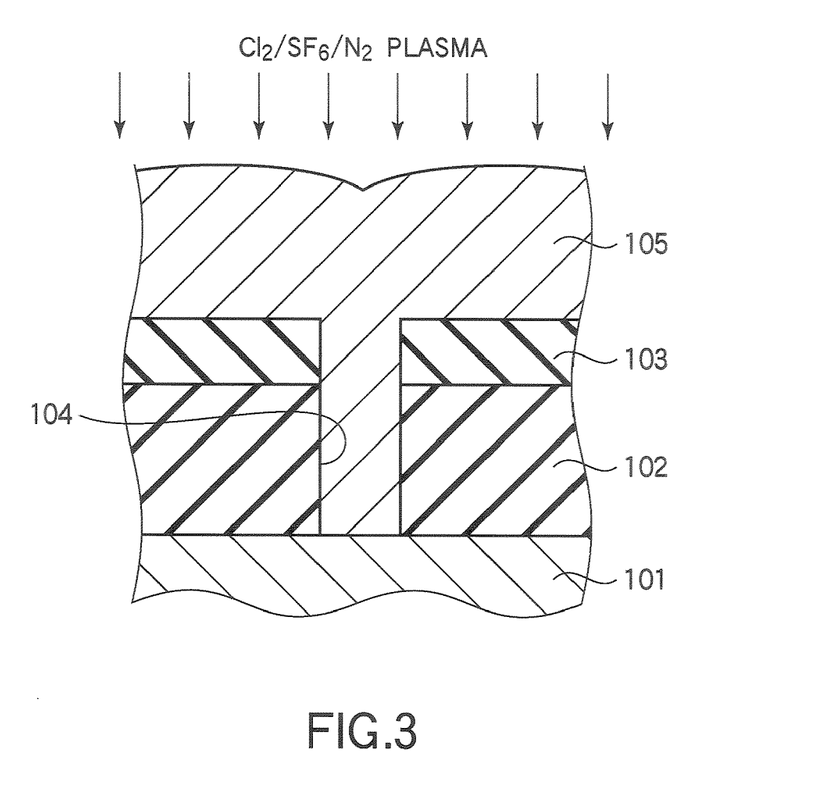
FIG. 3 is a view schematically showing a sectional structure near the surface of a semiconductor wafer being subjected to main etching.

On an Si substrate 101, a silicon oxide ($SiO_2$) film 102 serving as a first inter-level insulating film and a silicon nitride ($Si_3N_4$) film 103 serving as a second inter-level insulating film are stacked in this order from below. A contact hole 104 is formed through the films 102 and 103 and extended to the Si substrate 101. A poly-crystalline silicon film 105 is disposed to fill the contact hole 104 and cover the silicon nitride film 103. The etching-back process is performed to remove a part of the poly-crystalline silicon film 105 by etching, thereby leaving poly-crystalline silicon selectively in the contact hole 104.

This etching-back process for the poly-crystalline silicon film 105 has a problem in that certain roughness tends to appear on the surface of the poly-crystalline silicon film 105 during etching. If such roughness is formed on the surface of the poly-crystalline silicon film 105, this roughness may be copied and left on the silicon nitride film 103 after the poly-crystalline silicon film 105 is removed by the etching-back, and bring about defects in semiconductor devices. This surface roughness of the poly-crystalline silicon film 105 is thought to appear by the following mechanism.

The poly-crystalline silicon film 105, a part of which is to be left in the contact hole 104 at the end as a contact plug, is formed by a CVD process using, e.g., $SiH_4$ and $PH_3$ as source gases, so that the film is doped with phosphorous at a high concentration to increase the electrical conductivity. However, since poly-crystalline silicon has relatively large crystal grains, a dopant, such as phosphorous, is presumably mal-distributed at crystal grain boundaries. This distribution of dopant concentration may cause a difference in etching rate between the crystal grains and the grain boundaries, so certain roughness appears on the surface after etching.

As described above, when the poly-crystalline silicon film 105 is etched, it is important to make an etched surface smooth to prevent ill effects on devices. Further, in light of a practical use, it is important to attain a sufficient etching rate in addition to formation of a smooth etched surface. In other words, a process that entails a decrease in throughput and an increase in the number of process steps is not practical even if it can provide a smooth surface. According to this embodiment, etching is arranged to comprise a main etching step and an over etching step, and the combinations of gas species used for the respective etching steps are selected in accordance with the steps. Consequently, the poly-crystalline silicon film 105 can be etched to provide a smooth surface thereof, while maintaining a sufficient etching rate.

At first, as shown in FIG. 3, a main etching is performed on the poly-crystalline silicon film 105 by use of $Cl_2/SF_6/N_2$ plasma obtained by exciting $Cl_2$ gas, $SF_6$ gas, and $N_2$ gas. When the poly-crystalline silicon film 105 is etched in the plasma etching apparatus 1 shown in FIG. 1, the gate valve 38 is opened, and a wafer W having a structure as described above is transferred into the chamber 2 and placed on the susceptor 3. Then, the gate valve 38 is closed, and the susceptor 3 is moved up to set the distance between the surface of the wafer W on the susceptor 3 and the showerhead 21 to be within a range of about 30 to 90 mm. Further, the interior of the chamber 2 is exhausted by the vacuum pump of the exhaust unit 36 through the exhaust line 35. After the interior of the chamber 2 is set at a reduced pressure, a DC voltage is applied from the DC power supply 13 to the electrode 12 of the electrostatic chuck 11. Consequently, the wafer W is attracted and held by an electrostatic force on the electrostatic chuck 11.

Then, an etching gas comprising $Cl_2$ gas, $SF_6$ gas, and $N_2$ gas is supplied from the process gas supply system 30 into the chamber 2. Then, an RF power of, e.g., 60 MHz is applied from the RF power supply 40 to the showerhead 21 to generate an RF electric field between the upper electrode or showerhead 21 and the lower electrode or susceptor 3, so as to turn $Cl_2$ gas, $SF_6$ gas, and $N_2$ gas into plasma.

The etching gas plasma thus generated is used to perform the main etching on the poly-crystalline silicon film 105. At this time, an RF power with a predetermined frequency, such as 13.56 MHz, is applied from the RF power supply 50 to the lower electrode or susceptor 3 to attract ions in the plasma toward the susceptor 3.

Figure 4:
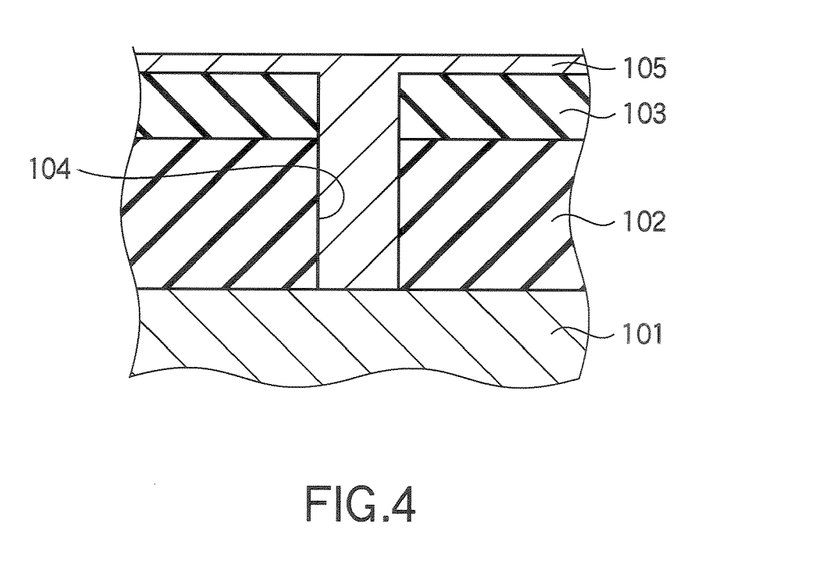
FIG. 4 is a view schematically showing the sectional structure near the surface of the semiconductor wafer after the main etching.

By performing the etching as described above, the main etching is finished, such that a thin part of the poly-crystalline silicon film 105, which has a film thickness of, e.g., 20 to 30 nm, is left on the silicon nitride film 103, as shown in FIG. 4.

In the main etching, $N_2$ gas is added to $Cl_2$ gas and $SF_6$ gas used as etchant supply sources, whereby the surface of poly-crystalline silicon film 105 is planarized. The $Cl_2$ gas contained therein contributes to an increase in etching rate by means of ion etching using Cl ions in plasma. The $SF_6$ gas contained therein serves as gas species for attaining a high etching rate and shortening the time period of the main etching step, and thus contributes to an improvement in throughput in the etching-back as a whole. This is so, because $SF_6$ gas provides a density of F atoms generated in plasma several times higher than that obtained by the other fluorine-containing gases, and S atoms contained in $SF_6$ prevent oxidation of the Si surface, thereby promoting etching.

Then, an etching gas comprising $Cl_2$ gas, HBr gas, and $CF_4$ gas is supplied from the process gas supply system 30 into the chamber 2. Then, an RF power of, e.g., 60 MHz is applied from the RF power supply 40 to the showerhead 21 to generate an RF electric field between the upper electrode or showerhead 21 and the lower electrode or susceptor 3, so as to turn $Cl_2$ gas, HBr gas, and $CF_4$ gas into plasma. At this time, an RF power with a predetermined frequency, such as 13.56 MHz, is applied from the RF power supply 50 to the lower electrode or susceptor 3 to attract ions in the plasma toward the susceptor 3.

Figure 5:
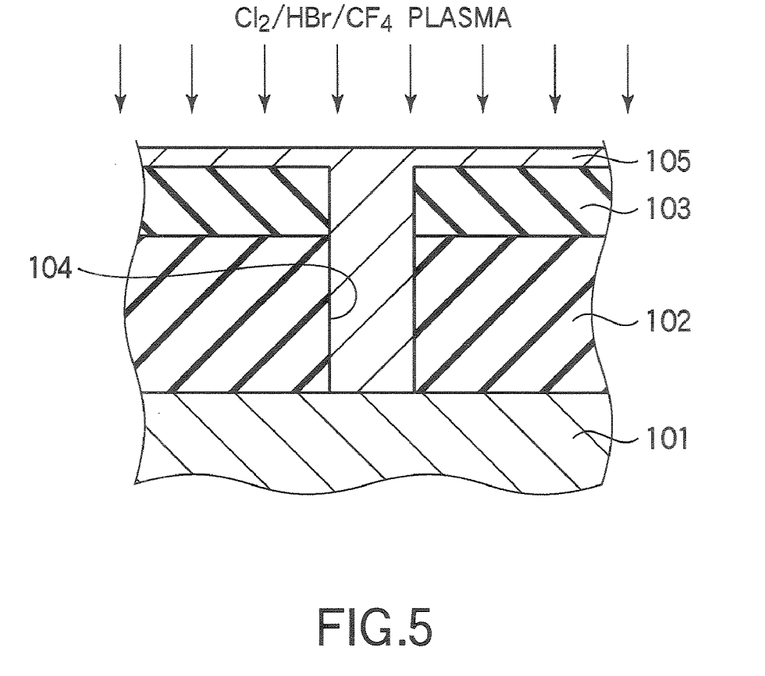
FIG. 5 is a view schematically showing the sectional structure near the surface of the semiconductor wafer being subjected to over etching.

The $Cl_2/HBr/CF_4$ plasma thus generated is used to perform an over etching, as shown in FIG. 5. This over etching is performed such that the remaining film (having a film thickness of 20 to 30 nm) of the poly-crystalline silicon film 105 left on the silicon nitride film 103 is completely removed, and the silicon nitride film 103 is slightly etched (for example, less than 10 nm).

The over etching step is arranged to use HBr gas, which tends to form reaction products ($SiBr_x$) by reaction with silicon, and $CF_4$, which tends to generate polymers, so that the remaining film of the poly-crystalline silicon film 105 is removed at an etching rate lower than that of the main etching step. Consequently, it is possible to prevent the poly-crystalline silicon filling the contact hole 104 from being excessively etched.

Figure 6:
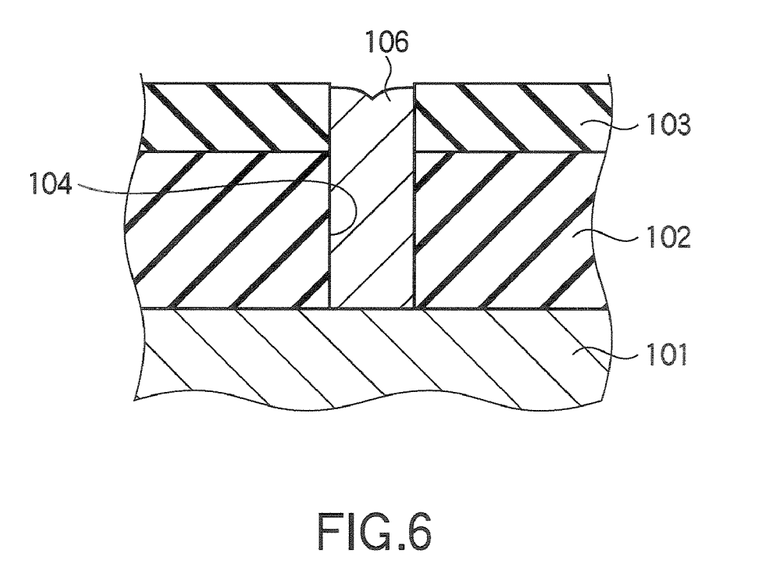
FIG. 6 is a view schematically showing the sectional structure near the surface of the semiconductor wafer after the over etching.

As described above, the main etching step using $Cl_2$ gas, $SF_6$ gas, and $N_2$ gas is combined with the over etching step using $Cl_2$ gas, HBr gas, and $CF_4$ gas, so that the etching-back is performed, while suppressing formation of roughness on the poly-crystalline silicon surface, to form the contact plug 106, as shown in FIG. 6. Since the etching is performed on the poly-crystalline silicon film 105 while keeping the surface thereof smooth, the surface of the silicon nitride film 103 receives no roughness copied from the poly-crystalline silicon film 105, and thus remains smooth even after the etching-back.

When the main etching is performed in the plasma etching apparatus 1, the conditions are preferably set as follows.

As regards the flow rate of the process gas, it is preferable that the flow rate of $Cl_2$ is set to be 100 to 200 mL/min (sccm), the flow rate of $SF_6$ to be 100 to 200 mL/min (sccm), and the flow rate of $N_2$ to be 50 to 200 mL/min (sccm), for example. In this case, in order to attain a sufficient effect of planarizing the etched surface, the flow rate of $N_2$ gas is preferably set to be, e.g., 25 to 40% of the total gas flow rate. If the ratio of the flow rate of $N_2$ gas relative to the total gas flow rate is lower than 25%, it is difficult to attain a sufficient planarization effect. On the other hand, if this ratio is higher than 40%, the effect is not expected to show a further improvement, while the etching rate may be decreased.

The pressure inside the chamber 2 during the main etching is preferably set to be, e.g., 4.0 to 12.0 Pa (30 to 90 mTorr).

The temperature of the susceptor during the main etching is preferably set to be, e.g., 40 to 70° C.

When the over etching is performed in the plasma etching apparatus 1, the conditions are preferably set as follows.

As regards the flow rate of the process gas, it is preferable that the flow rate of $Cl_2$ is set to be 30 to 100 mL/min (sccm), the flow rate of HBr to be 100 to 200 mL/min (sccm), and the flow rate of $CF_4$ to be 30 to 100 mL/min (sccm), for example.

The pressure inside the chamber 2 and the temperature of the susceptor may be set to be the same as those used in the main etching.

In a preferable embodiment, $N_2$ gas may be added during the over etching. Where $N_2$ gas is added to the over etching process gas comprising $Cl_2$ gas, HBr gas, and $CF_4$ gas, the effect of providing a smooth surface of the silicon nitride film 103 becomes more reliable. In this case, $N_2$ gas may be kept supplied during the entire over etching step, or may be supplied in some of sub-steps of the over etching step. As regards the flow rate of the process gas in a case where $N_2$ gas is supplied for the over etching, it is preferable that the flow rate of $Cl_2$ is set to be 30 to 100 mL/min (sccm), the flow rate of HBr to be 100 to 200 mL/min (sccm), the flow rate of $CF_4$ to be 30 to 100 mL/min (sccm), and the flow rate of $N_2$ to be 50 to 200 mL/min (sccm), for example.

Next, an explanation will be given of results of experiments performed to confirm effects of the present invention.

The plasma etching apparatus 1 shown in FIG. 1 was used to perform a plasma etching process on a multi-layered structure, as shown in FIG. 3, under the following conditions, thereby carrying out etching-back of a poly-crystalline silicon film. The plasma etching process was arranged to comprise the main etching and over etching.

In the multi-layered structure, the initial film thickness of the silicon nitride film 103 was 167 nm, and the initial film thickness of the poly-crystalline silicon film 105 was 245 nm. The poly-crystalline silicon film 105 had been formed by a CVD process using $SiH_4$ and $PH_3$ as source gases at a temperature of about 530 to 580° C., so that the film was doped with phosphorous at $3\times10^{19}$ to $5\times10^{20}$ atoms/cm².

The etching conditions were as follows.

<Main Etching>

$Cl_2/SF_6/N_2$=150/150/100 mL/min (sccm),

Pressure=6.7 Pa (50 mTorr),

Upper electrode RF power (60 MHz)=600 W, lower electrode RF power (13.56 MHz)=400 W, Back side pressure (central portion/edge portion) =1,333 Pa/1,333 Pa (10/10 Torr; He gas), Distance between upper and lower electrodes=170 mm, and Temperature (upper electrode/chamber sidewall/lower electrode)=80° C./60° C./60° C.

<Over Etching>

$Cl_2$/HBr/$CF_4$=70/150/60 mL/min (sccm),

Pressure=6.7 Pa (50 mTorr),

Upper electrode RF power (60 MHz)=300 W,

Lower electrode RF power (13.56 MHz)=300 W,

Back side pressure (central portion/edge portion)=1,333 Pa/1,333 Pa (10/10 Torr; He gas), Distance between upper and lower electrodes=170 mm, and Temperature (upper electrode/chamber sidewall/lower electrode)=80° C./60° C./60° C.

For comparison, etching was performed on the same multi-layered structure under the same conditions as described above, except that $N_2$ gas was not added in the main etching.

Figure 7:
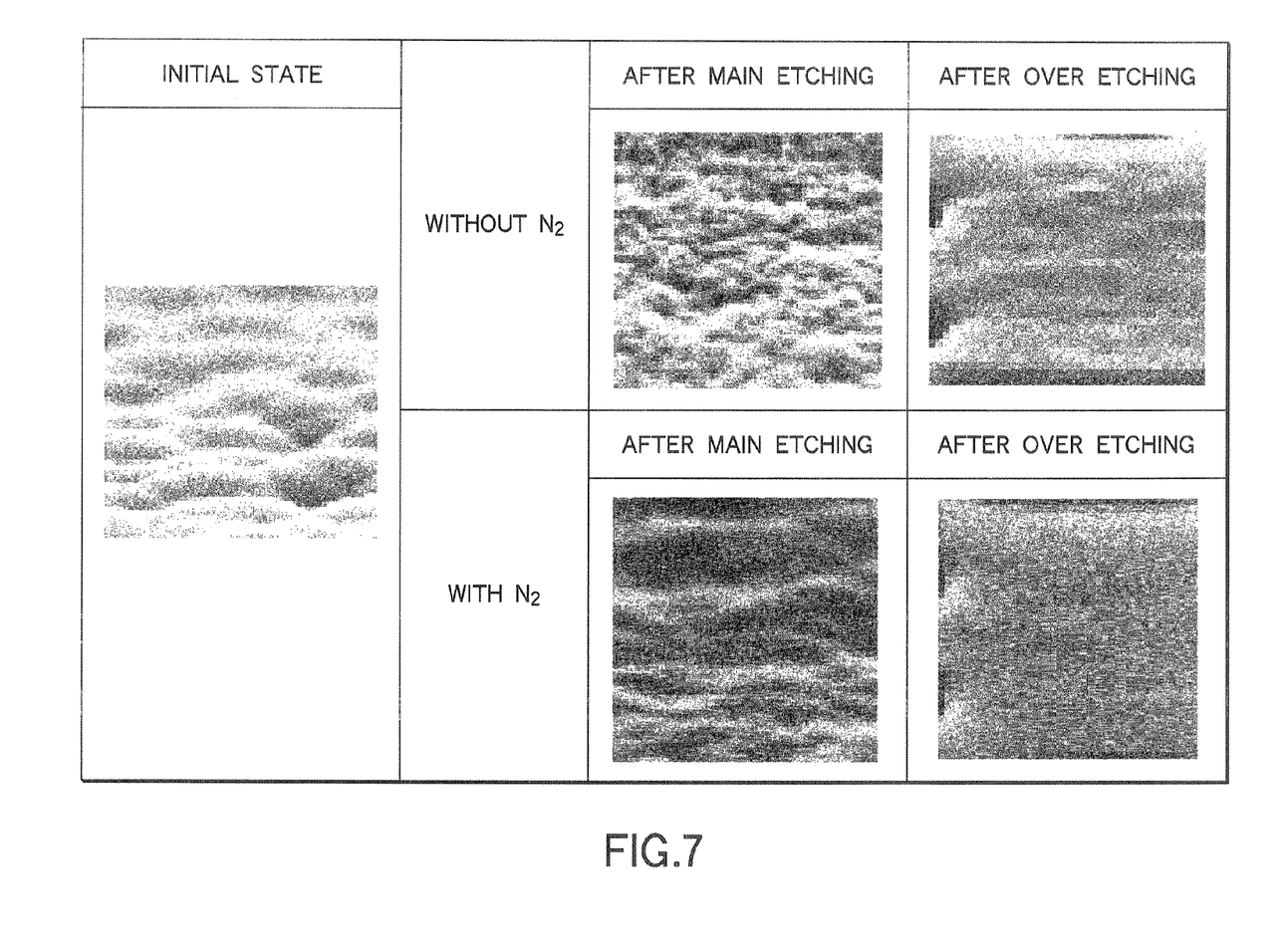
FIG. 7 is a view for explaining differences caused by use and nonuse of addition of $N_2$ gas.

In both of the cases where $N_2$ gas was added in the main etching and where $N_2$ gas was not added in the main etching, electron microscope observation and surface roughness (Ra) measurement were performed on the surface of the poly-crystalline silicon film 105 after the main etching, and the surface of the silicon nitride film 103 after the over etching. FIG. 7 shows results (photographs) of the electron microscope observation, and Table 1 shows results of the surface roughness (Ra) measurement.

TABLE 1

|  | Ra (nm) | |
| --- | --- | --- |
|  | After main etching | After over etching |
| Without $N_2$ | 35.6 | 10.0 |
| With $N_2$ | 14.7 | 5.7 |

As shown in FIG. 7 and Table 1, where $N_2$ gas was not added, a number of rough portions were formed on the surface of the poly-crystalline silicon film 105 after the main etching, and were copied on the surface of the silicon nitride film 103 after the over etching. On the other hand, where $N_2$ gas was added in the main etching process gas, the surface of the poly-crystalline silicon film 105 after the main etching was obviously planarized, and the surface of the silicon nitride film 103 after the over etching was smooth.

Further, where $N_2$ gas was added in the main etching process gas, the etching rate in the main etching step was 530 nm/min, i.e., a practically sufficient etching rate was attained. On the other hand, where $N_2$ gas was not added in the main etching process gas, the etching rate in the main etching step was 565 nm/min, i.e., the etching rate did not differ so much by addition of $N_2$ gas.

Figure 8:
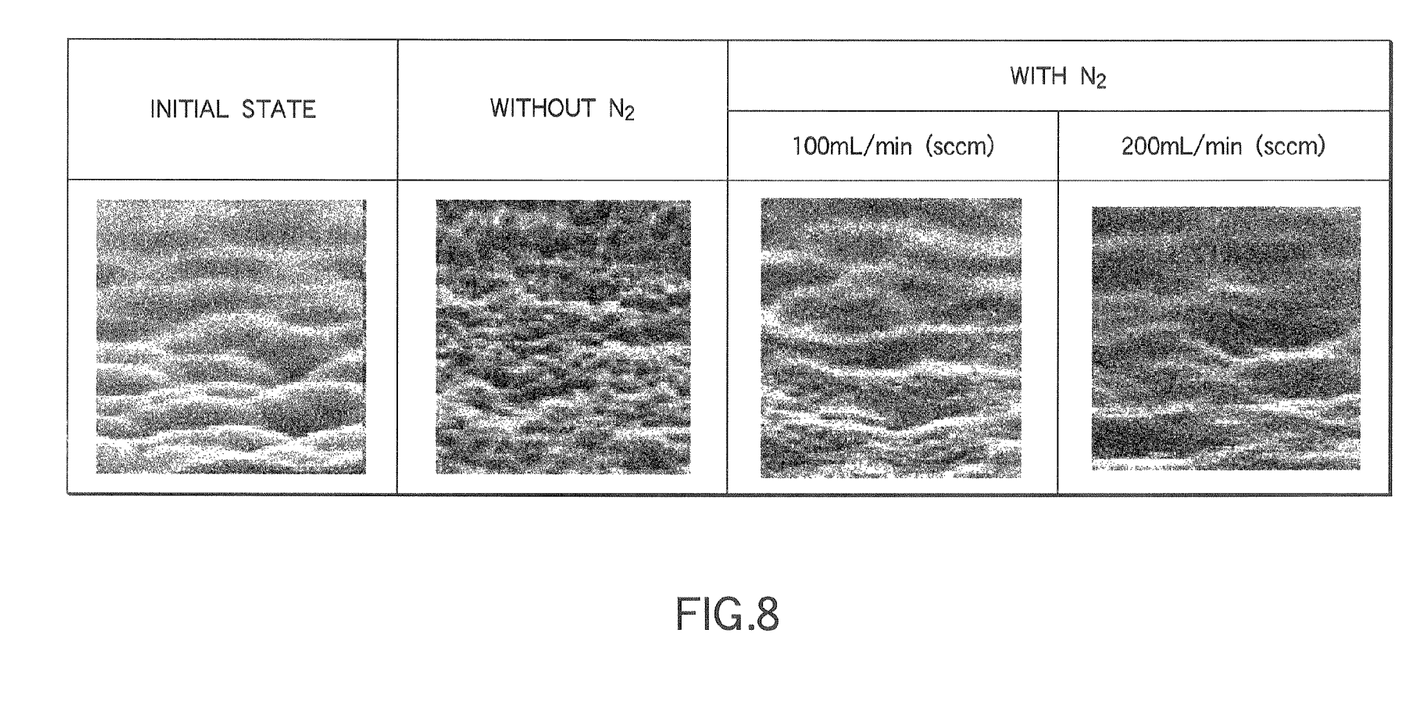
FIG. 8 is a view showing states of an etched surface where the flow rate of $N_2$ gas was set at different values.

Further, the main etching step was performed under the same conditions as described above, except that the flow rate of $N_2$ gas was set at different values. FIG. 8 comprises electron microscope photographs showing states of the surface of the poly-crystalline silicon film 105 after the etching. In this experiment, comparison was made between a case where $N_2$ gas was not added, a case where $N_2$ gas was added at 100 mL/min (sccm) (a ratio of 25% relative to the total gas flow rate), and a case where $N_2$ gas was added at 200 mL/min (sccm) (a ratio of 40% relative to the total gas flow rate). In the respective conditional cases, surface roughness (Ra) measurement was performed on the surface of the poly-crystalline silicon film 105 after the main etching step. Table 2 shows results of the surface roughness (Ra) measurement.

TABLE 2

|  | Ra (nm) |
| --- | --- |
| Without $N_2$ | 35.6 |
| With $N_2$ at 100 mL/min (sccm) | 14.7 |
| With $N_2$ at 200 mL/min (sccm) | 12.6 |

As shown in FIG. 8 and Table 2, where the ratio of the flow rate of $N_2$ in the main etching process gas was 40%, the surface of the poly-crystalline silicon film 105 after the main etching was more planarized, as compared to the case where the ratio of the flow rate of $N_2$ was 25%.

Further, where $N_2$ gas was added at 100 mL/min in the main etching process gas, the etching rate was 581 nm/min. Where $N_2$ gas was added at 200 mL/min in the main etching process gas, the etching rate was 554 nm/min. Accordingly, in both of the cases, a practically sufficient etching rate was attained.

It has been confirmed from the results described above that an excellent effect of planarizing the surface of the poly-crystalline silicon film 105 is obtained where the flow rate of $N_2$ in the main etching process gas makes up a ratio within a range of 25% to 40%.

Further, after the main etching step was performed under the same conditions as described above (the flow rate of $N_2$ gas was 100 mL/min), the over etching step was performed by two sub-steps such that $N_2$ gas was supplied only in the second period (the second sub-step). Specifically, the over etching step was arranged to have a first period for 7 seconds in which the etching gas was set to be $Cl_2/HBr/CF_4=70/150/60$ mL/min (sccm), and a second period for 13 seconds in which the etching gas was set to be $Cl_2/HBr/CF_4/N_2=70/150/60/40$ mL/min (sccm). The other conditions of the over etching are the same as those described above.

Figure 9:
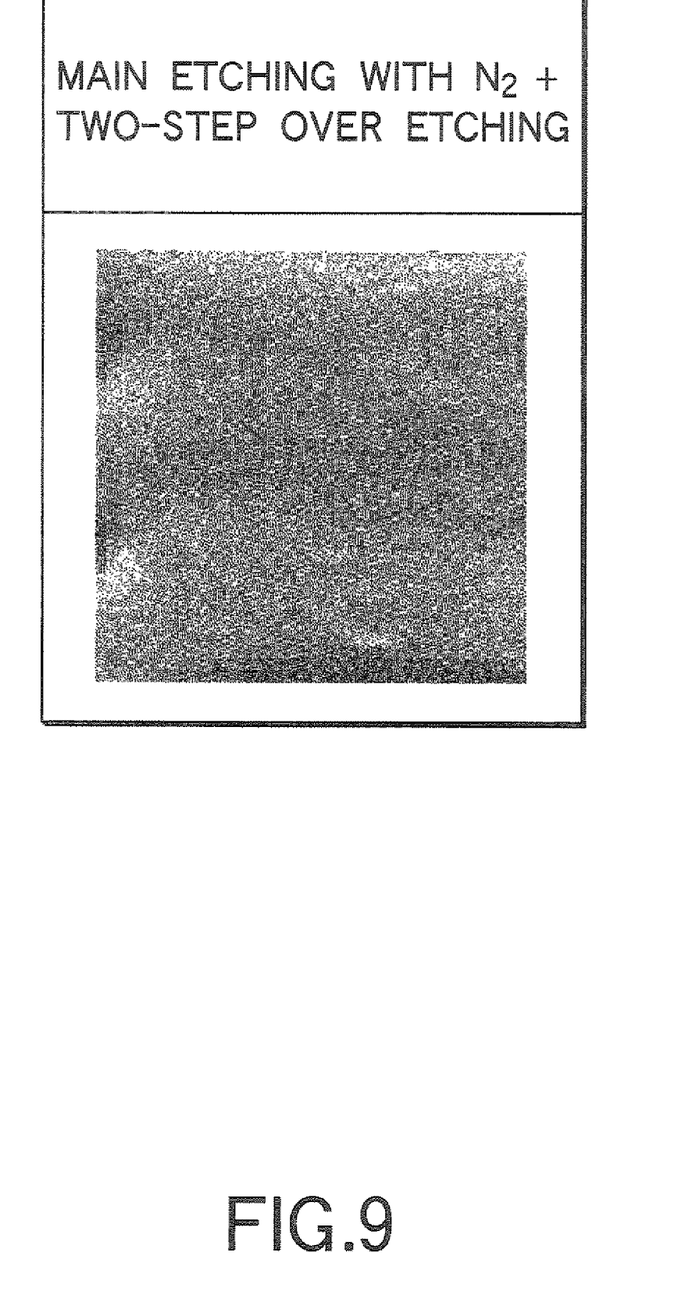
FIG. 9 is a view showing a state of an etched surface where $N_2$ gas was added for over etching.

FIG. 9 is an electron microscope photograph showing a state of the surface of the silicon nitride film 103 after the over etching performed by the two sub-steps. The surface roughness (Ra) measurement was performed on this surface, and resulted in 5.7 nm. It has been confirmed from the results described above that the effect of planarizing the surface of the silicon nitride film 103 becomes more reliable where the over etching step is performed by use of $N_2$ added to $Cl_2$, HBr, and $CF_4$ after the main etching is performed by use of $N_2$ added to $Cl_2$ and $SF_6$.

As described above, a plasma etching method according to the present invention allows the etching to be performed while suppressing formation of roughness on the surface of a poly-crystalline silicon film treated as an etching target film. For example, where a method according to the present invention is applied to an etching-back process for forming a contact plug from poly-crystalline silicon, it is possible to prevent defects from being caused in devices due to roughness copied from the poly-crystalline silicon surface onto an inter-level insulating film surface.

Accordingly, a processing method according to the present invention may be preferably applied to a process for manufacturing semiconductor devices, such as DRAMs, in which formation of contact plugs is repeatedly performed by an etching-back process.

The present invention is not limited to the embodiments described above, and it may be modified in various manners. For example, in the embodiments described above, the plasma etching apparatus is exemplified by a parallel-plate type in which RF powers are respectively applied to the upper and lower electrodes. However, the apparatus is not limited to this type, and the present invention may be applied to an apparatus of the type that applies an RF power only to one of the upper and lower electrodes.

Alternatively, the present invention may be applied to a plasma etching apparatus of the magnetron RIE type that employs permanent magnets. Furthermore, the apparatus is not limited to a plasma etching apparatus of the capacitive coupling type, and the present invention may be applied to another one of various plasma etching apparatuses, such as an apparatus of the inductive coupling type.

Accordingly, the present invention is preferably applicable to various processes for manufacturing semiconductor devices, such as DRAMs.

What is claimed is:

1. A plasma etching method comprising:
   preparing a target object with a poly-crystalline silicon film formed thereon;
   performing first etching on the poly-crystalline silicon film by use of plasma of an etching gas containing $SF_6$, $Cl_2$, and $N_2$; and
   performing second etching on the poly-crystalline silicon film by use of plasma of an etching gas containing $Cl_2$, HBr, and $CF_4$ after the first etching.

2. The etching method according to claim 1, wherein the first etching is arranged to set a flow rate of $N_2$ to make up a ratio of 25 to 40% relative to a total flow rate of the etching gas thereof.

3. The etching method according to claim 1, wherein the poly-crystalline silicon film is doped with phosphorous.

4. A plasma etching method comprising:
   preparing a target object with a poly-crystalline silicon film formed thereon;
   performing first etching on the poly-crystalline silicon film by use of plasma of an etching gas containing $SF_6$, $Cl_2$, and $N_2$;
   performing second etching on the poly-crystalline silicon film by use of plasma of an etching gas containing $Cl_2$, HBr, and $CF_4$ after the first etching; and
   performing third etching on the poly-crystalline silicon film by use of plasma of an etching gas containing $Cl_2$, HBr, $CF_4$, and $N_2$ after the second etching.

5. The etching method according to claim 4, wherein, wherein the first etching is arranged to set a flow rate of $N_2$ to make up a ratio of 25 to 40% relative to a total flow rate of the etching gas thereof.

6. The etching method according to claim 4, wherein the poly-crystalline silicon film is doped with phosphorous.

7. A plasma etching method comprising:
   preparing a target object having an insulating film with a through-hole formed therein, and a poly-crystalline silicon film covering the insulating film; and
   performing etching-back of the poly-crystalline silicon film, thereby leaving poly-crystalline silicon selectively within the through-hole,
   wherein the etching-back of the poly-crystalline silicon film comprises performing first etching on the poly-crystalline silicon film by use of plasma of an etching gas containing $SF_6$, $Cl_2$, and $N_2$, and performing second etching on the poly-crystalline silicon film by use of plasma of an etching gas containing $Cl_2$, HBr, and $CF_4$ after the first etching.

8. The etching method according to claim 7, wherein the etching-back of the poly-crystalline silicon film comprises performing third etching on the poly-crystalline silicon film by use of plasma of an etching gas containing $Cl_2$, HBr, $CF_4$, and $N_2$ after the second etching.

9. The etching method according to claim 7, wherein the insulating film is a silicon nitride film.

10. The etching method according to claim 7, wherein, wherein the first etching is arranged to set a flow rate of $N_2$ to make up a ratio of 25 to 40% relative to a total flow rate of the etching gas thereof.

11. The etching method according to claim 7, wherein the poly-crystalline silicon film is doped with phosphorous.

12. A non-transitory storage medium that stores a program for execution on a computer to control a plasma processing apparatus, the program, when executed by the computer, controlling the plasma processing apparatus to perform a plasma etching method comprising,
   preparing a target object with a poly-crystalline silicon film formed thereon,
   performing first etching on the poly-crystalline silicon film by use of plasma of an etching gas containing $SF_6$, $Cl_2$, and $N_2$, and
   performing second etching on the poly-crystalline silicon film by use of plasma of an etching gas containing $Cl_2$, HBr, and $CF_4$ after the first etching.

13. A non-transitory storage medium that stores a program for execution on a computer to control a plasma processing apparatus, the program, when executed by the computer, controlling the plasma processing apparatus to perform a plasma etching method comprising,
   preparing a target object with a poly-crystalline silicon film formed thereon, performing first etching on the poly-crystalline silicon film by use of plasma of an etching gas containing $SF_6$, $Cl_2$, and $N_2$, performing second etching on the poly-crystalline silicon film by use of plasma of an etching gas containing $Cl_2$, HBr, and $CF_4$ after the first etching, and performing third etching on the poly-crystalline silicon film by use of plasma of an etching gas containing $Cl_2$, HBr, $CF_4$, and $N_2$ after the second etching.

14. A non-transitory storage medium that stores a program for execution on a computer to control a plasma processing apparatus, the program, when executed by the computer, controlling the plasma processing apparatus to perform a plasma etching method comprising, preparing a target object having an insulating film with a through-hole formed therein, and a poly-crystalline silicon film covering the insulating film, and performing etching-back of the poly-crystalline silicon film, thereby leaving poly-crystalline silicon selectively within the through-hole, wherein the etching-back of the poly-crystalline silicon film comprises performing first etching on the poly-crystalline silicon film by use of plasma of an etching gas containing $SF_6$, $Cl_2$, and $N_2$, and performing second etching on the poly-crystalline silicon film by use of plasma of an etching gas containing $Cl_2$, HBr, and $CF_4$ after the first etching.

* * * * *